(12) United States Patent
Oxford et al.

(10) Patent No.: US 9,532,143 B2
(45) Date of Patent: *Dec. 27, 2016

(54) LOW FREQUENCY EQUALIZATION FOR LOUDSPEAKER SYSTEM

(76) Inventors: J. Craig Oxford, Nashville, TN (US); D. Michael Shiekts, St. Paul, MN (US)

( * ) Notice: Subject to any disclaimer, the term of this patent is extended or adjusted under 35 U.S.C. 154(b) by 44 days.

This patent is subject to a terminal disclaimer.

(21) Appl. No.: 13/351,834

(22) Filed: Jan. 17, 2012

(65) Prior Publication Data

US 2013/0016857 A1    Jan. 17, 2013

Related U.S. Application Data

(63) Continuation of application No. 11/708,406, filed on Feb. 20, 2007, now Pat. No. 8,098,849, which is a continuation-in-part of application No. 11/324,650, filed on Jan. 3, 2006, now abandoned.

(51) Int. Cl.
| | |
|---|---|
| *H04R 3/00* | (2006.01) |
| *H04R 3/04* | (2006.01) |
| *H04R 1/22* | (2006.01) |
| *H04R 1/28* | (2006.01) |

(52) U.S. Cl.
CPC ............... *H04R 3/04* (2013.01); *H04R 1/227* (2013.01); *H04R 1/2873* (2013.01)

(58) Field of Classification Search
CPC .................................. H04R 3/00; H04R 3/04
USPC .................... 381/117, 120, 386, 182, 111
See application file for complete search history.

(56) References Cited

U.S. PATENT DOCUMENTS

| | | | | |
|---|---|---|---|---|
| 5,147,986 A | * | 9/1992 | Cockrum | H04R 29/003 181/145 |
| 5,596,650 A | * | 1/1997 | Hlibowicki | H03G 5/025 381/103 |
| 8,098,849 B2 | * | 1/2012 | Oxford | H04R 3/04 381/117 |

* cited by examiner

*Primary Examiner* — Alexander Jamal
(74) *Attorney, Agent, or Firm* — Wayne Edward Ramage; Baker Donelson

(57) ABSTRACT

A method of optimizing the low frequency audio response emanating from a pair of low frequency transducers housed within a cabinet. The low frequency transducers are electrically connected to a power amplifier and source of audio content. The resonant frequency (Fs) and amplitude (Q) are characterized as to the high-pass pole of the low frequency transducers as they are mounted within the cabinet. An equalizer is placed between the amplifier and source of audio content for canceling the complex pole of the low frequency transducers and for establishing a new complex pole at a cut off frequency below which the sound generated by the low frequency transducers will diminish.

9 Claims, 9 Drawing Sheets

LOW FREQUENCY EQUALIZATION FOR LOUDSPEAKER SYSTEM

This application is a continuation of U.S. patent application Ser. No. 11/708,406, filed Feb. 20, 2007, now issued as U.S. Pat. No. 8,098,849, which is a continuation-in-part application of U.S. patent application Ser. No. 11/324,650, filed Jan. 3, 2006 now abandoned, and is entitled to those filing dates for priority in whole or in part. The specification, figures and complete disclosure of U.S. patent application Ser. Nos. 11/708,406 and 11/324,650 are incorporated herein by specific reference for all purposes.

FIELD OF INVENTION

The present invention involves a method of optimizing the low frequency audio response emanating from a pair of low frequency transducers housed within a cabinet. When the proper equalization circuit is installed within the audio chain, the woofer portion of a speaker system can be optimized to an extent not previously achievable.

BACKGROUND OF THE INVENTION

Loudspeaker systems including those intended for residential two channel audio or multi-channel theater systems intend to embrace a substantial portion of the audio frequency range discernable by a listener. An important part of this range are low frequencies produced by relatively large loudspeaker transducers, generally known as woofers.

As with the mid and high-frequency parts of the audible range, it is known that the correct reproduction of musical pitch and timbre is strongly related to the attack part of the sound and less so to the decay part. The low frequencies are important in this regard because in all of occidental music the harmony is built upon the bass. If the reproduction of the bass frequencies has a slow attack, the overall sound is perceived as having an uncertain sense of pitch and a poor sense of rhythmic drive. It is thus of very great importance to design woofer systems which correctly render the attack part of the sound.

The correct rendering of the attack requires the ability for the motor of the loudspeaker to quickly accelerate the diaphragm. Since acceleration is proportional to force divided by mass it is necessary that the woofer transducer has a light moving system and a powerful motor. Conventionally designed woofer systems generally embody the opposite of these requirements. This is because there is a universal desire to make the woofer enclosure as small as possible. As will be discussed below, the stiffness of the air in the enclosure adversely modifies the characteristic of the woofer transducer, making optimization difficult at best and often impossible.

An excellent woofer system is shown schematically in FIG. 1. Woofer system 10 is comprised of cabinet 11 housing low frequency transducers 12 and 13. These low frequency transducers ideally operate in phase with each other whereby diaphragms 14 and 15 face each other being driven by motor assemblies 16 and 17. When low frequency transducers 12 and 13 are mounted opposite to one another as shown FIG. 1, large reaction forces associated with high power woofers located in cabinet structure 11 need not rely on mechanical grounding of the cabinet to the surrounding structures upon which the cabinet is placed.

In analyzing the low frequency transducer model of FIG. 1, one can create an electrical equivalent circuit (mobility analogy) of this assembly in free air. This is shown in FIG. 2A as a second-order resonant circuit with a natural frequency determined by the stiffness of the suspension and mass of the moving system. The amplitude (Q) of this resonance is determined by the damping due to mechanical loss. The resonance can be defined in terms of frequency and Q, and it constitutes a complex high-pass pole in the response of the loudspeaker.

Notwithstanding the above discussion, the electrical equivalent circuit shown in FIG. 2A does not tell the entire story. In this regard, reference is made to FIG. 2B. In this regard, when low frequency transducers 12 and 13 are placed within cabinet 11 which can be, for example, a sealed box, the stiffness of the air in the box is added to the stiffness of the suspension of the low frequency transducers and is shown as a parallel inductor. The consequence of this is that both the resonant frequency and Q are raised in value by approximately the square root of (1+(the stiffness of the speaker divided by the stiffness of the air in the box)). This can graphically be depicted by comparing FIGS. 2C and 2D.

A design goal of a woofer system is to maintain a low resonant frequency. Traditionally, this was done by increasing the moving mass (diaphragms 14 and 15), decreasing diaphragm stiffness or both. Stiffness has traditionally been decreased by making suspension components employed in such transducers more flexible or "limp" or by making enclosure 11 larger. Again, moving mass can only be increased by making diaphragms 14 and 15 heavier. However, adopting any of these traditional expedients represent a significant compromise as they tend to degrade performance of the woofer system. Softer suspension parts are not reliable, particularly if they are carrying a greater mass. Increased mass further requires a corresponding increase in motor strength if the ability to accelerate diaphragms 14 and 15 is to be maintained. A larger motor translates directly to higher production costs and a larger enclosure 11 may not be a suitable solution as cabinet size is generally considered to be a design constraint on any loudspeaker system. As a result, those engaged in loudspeaker design generally simply choose appropriately sized low frequency transducers, enclose them in an available volume and accept the resulting response.

It is thus an object of the present invention to provide a novel technique for dealing with the resonance of a low frequency transducer system.

It is yet a further object of the present invention to improve the operating range of a woofer system by providing an electrical circuit as an equal within the audio chain.

These and further objects will be more readily apparent when considering the following disclosure and appended claims.

SUMMARY OF THE INVENTION

The present invention involves a method of optimizing the low frequency audio response emanating from a pair of low frequency transducers housed within a cabinet, said low frequency transducers being electrically connected to a power amplifier and source of audio content, said method comprises characterizing the resonant frequency (Fs) and amplitude (Q) of the high-pass pole of the low frequency transducers as they are mounted within said cabinet, placing an equalizer between said amplifier and source of audio content. Said equalizer canceling the complex pole of the low frequency transducers and establishing a new complex pole thus establishing a new cut off point below which the low frequency sound will diminish. The topology of the equalizer permits independent variation of the parameters which facilitates dynamic variation of said parameters to continuously adapt the equalizer in order to prevent excessive excursion of the woofers.

DETAILED DESCRIPTION OF THE INVENTION

Figure 1:
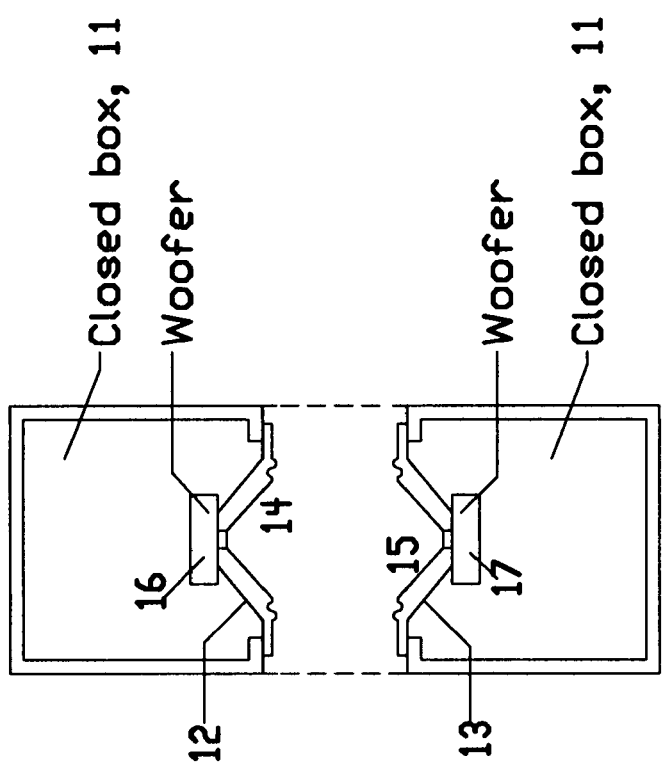
FIG. 1 is a side cut away view of a typical woofer cabinet and enclosed low frequency transducers which can be employed in benefiting from the present invention.

The present design approach or method of optimizing low frequency transducer response in a loudspeaker system bears little or no parallel to loudspeaker design methodology engaged in previously. In the past, a designer would select what is believed to be properly sized and dimensioned transducers placed in what is hoped to be an appropriately sized cabinet fed by low frequencies emanating from a power amplifier through an appropriate cross over network. In practicing the present invention, however, a designer could begin with a preconfigured woofer system and by inserting the appropriate equalization circuit between the power amplifier and the audio content source, this woofer system can be optimized.

All woofer systems have a natural resonance or preferred natural frequency. In an electric circuit or an electric analogy to a mechanical system, resonance occurs because of the exchange of energy between the reactive elements, i.e., capacitance and inductance, of the circuit. It is recognized that the resistive elements of a circuit are dissipative, noting if there was no resistance in a circuit (which is obviously a physical impossibility), the resonant exchange of energy or oscillation would persist indefinitely. As resistance is introduced into this ideal model, the quality of the resonance or its amplitude (Q) deteriorates. In the loudspeaker electrical analogy at hand, capacitance corresponds to mass, inductance corresponds to compliance and resistance corresponds to mechanical resistance Obviously, the opposite of Q is damping (d) so that d=1/Q. As such, any single resonance can be characterized by its frequency and its Q (or d), the mathematical description of a resonant system can be described as follows where:

$$S = j\omega + \emptyset$$

S=Complex frequency variable
j=square root of (−1), the complex operator
ω=2πf, where f is in Hz=$1/\sqrt{mass \times compliance}$
Ø=Phase angle The notation of this equation denotes a real and an imaginary axis for S. When a resonant circuit is expressed in S, the roots of the equation in the numerator represent "zeros" in the "S-plane" and the roots of the denominator represent "poles" in the S-plane. In solving the transfer function for a system with both poles and zeros noting that not all systems have both, if there are identical coefficients for a pole and a zero, they cancel each other. A complex pole in S is a resonance and can be described in terms of F and Q.

It is recognized herein that any speaker, by itself, has a fundamental resonant frequency (Fs) related to the mass of the diaphragm or cone oscillating on the compliance of the transducer suspension. The sharpness of this resonance is determined by the friction losses in the parts and by the electromagnetic drag from the motor which both drives and brakes the diaphragm.

It is further recognized that if one places a transducer in a cabinet, the stiffness of whose air volume is significant, generally characterized by a relatively small cabinet, the radian frequency (ω) will increase because compliance decreases. The result is a new resonant frequency for the complete system, denoted as Ftc, Qtc. It is a property of direct radiator loudspeakers that below their resonant frequency, response diminishes. For a closed-box system, the response falls asymptotically to 12 dB/octave below the resonance. As such, if the resonance has been pushed up in frequency by a too-small box, the useful low frequency response will be diminished.

Figure 2A:
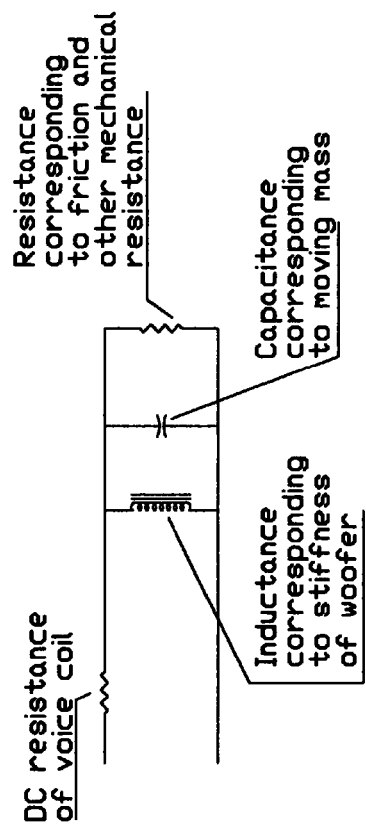
FIGS. 2A and 2B are electrical equivalent circuits of the woofer assembly of FIG. 1 in free air (FIG. 2A) and in a sealed cabinet (FIG. 2B).
Figure 2B:
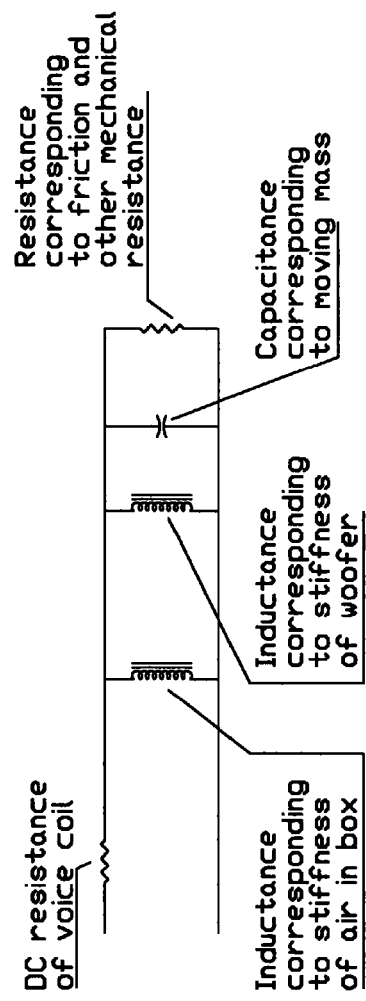
Figure 2C:
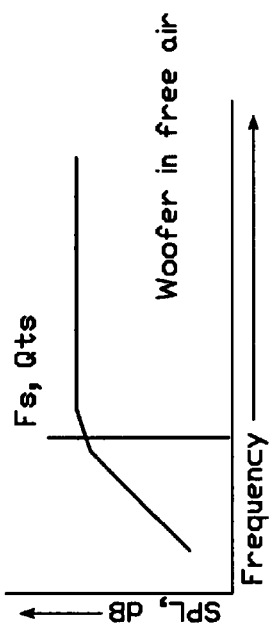
FIGS. 2C and 2D correspond to FIGS. 2A and 2B, respectively, showing a graphical equivalent of the relationship between the output or response (dB) and frequency of woofer systems.
Figure 2D:
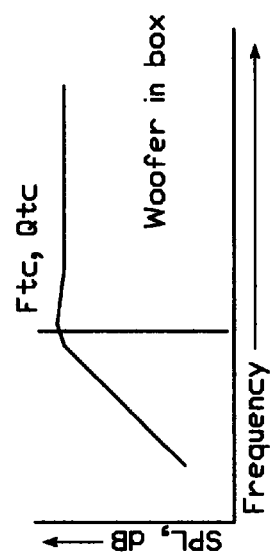

These characteristics were previously discussed with regard to FIGS. 2A and 2B and the corresponding FIGS. 2C and 2D. As to FIGS. 2A and 2C, the woofer or low frequency transducer in free air shows that it is a second-order resonant circuit with a natural frequency determined by the stiffness of the suspension and the mass of the moving system. The amplitude of this resonance (Q) is determined by damping due to mechanical losses and, as noted above, is defined in terms of frequency and Q as it constitutes a complex high-pass pole in the response of the loudspeaker. By contrast, as noted in reference to FIGS. 2B and 2D, the stiffness of the air in the box is added to the stiffness of the suspension of the speaker shown as a parallel inductor. The consequence of this is that both the resonant frequency and its Q are raised in value by approximately the square root of (1+(the stiffness of the speaker divided by the stiffness of air in the box)). Designers in the past have attempted to keep resonant frequency low by increasing moving mass and decreasing stiffness of the transducer, or both. However, as noted above, these design goals are difficult to achieve. By contrast, the present invention optimizes the transducers enclosed in an available volume by providing an equalizing circuit imposed between the source of an audio signal and power amplifier used to drive the lowest frequency transducers.

Although the equal g circuit will be described in detail hereinafter, broadly, it operates by 1) characterizing the enclosed woofer system as to its resonant frequency (Fs) and Q of its high-pass complex pole, 2) placing a matching complex zero in the signal path to cancel the speaker characteristic and 3) establishing a new complex pole at an arbitrarily chosen low frequency which defines the new low frequency cut off of the woofer system. This latter characteristic of the equalizing circuit is necessary to prevent the woofer system from being overrun by large signals below the intended operating range and may be made dynamically variable to extend the dynamic range.

Figure 3:
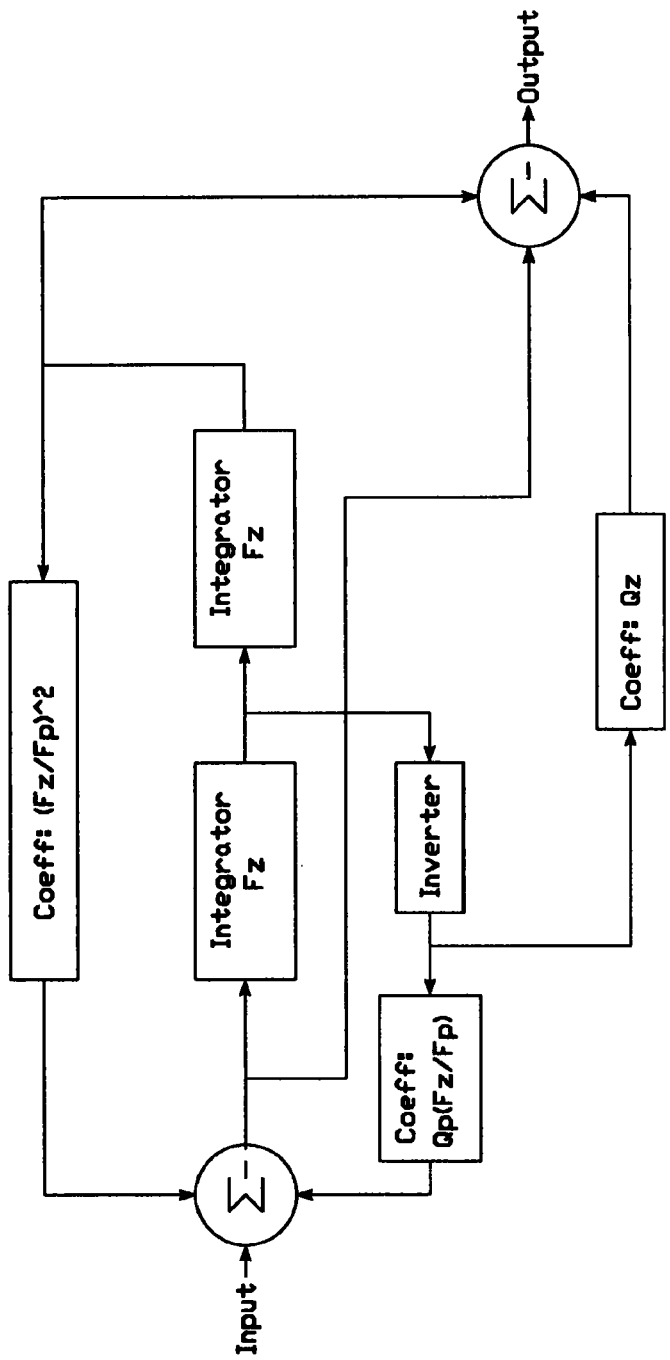
FIG. 3 is a block diagram of the equalizer system made the subject of the present invention.
Figure 4:
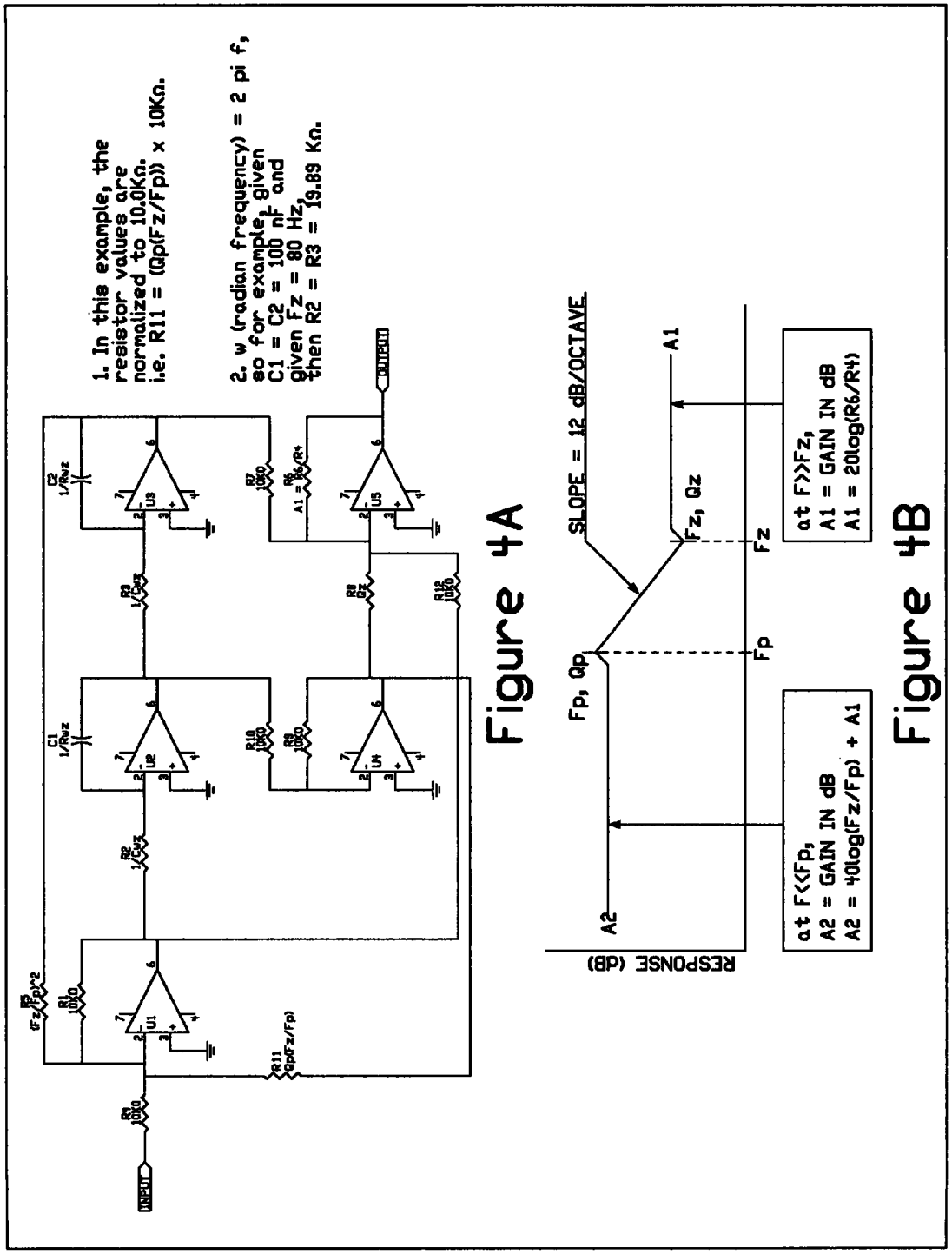
FIGS. 4A and 4B are schematic layouts and graphical depictions of the equalizer system shown in FIG. 3.

FIG. 3 provides a conceptual diagram of the equalizer of the present invention. This is a two integrator state-variable filter which is topologically well known in the art of filter design. The conjugate equalizer shown in FIG. 3 is illustrated schematically in FIG. 4. In the example of FIG. 4, resistor values are normalized to 10.0 KΩ. For example $R11=Q_p (F_z/F_p) \times 10$ K'Ω. The radian frequency (ω) equals $2 \pi f$ so that, for example, given C1=C2=100 nF and given $F_z$=70 Hz, then R2=R3=22.74 K'Ω. The functions are U1 and U5 are inverting summing amplifiers. U2 and U3 are integrators. U4 is a unity-gain inverting amplifier. As such, Fz, Qz of the equalizer cancels the complex pole of the speaker denoted as Ftc, Qtc. The combined response then remains flat down to Fp, Qp which is the new cut off frequency for the complete system. There are simpler circuits which will accomplish the conjugate equalization, but the two-integrator state-variable filter has the advantage that the four parameters of interest, Fz, Qz, Fp and Qp are independently adjustable. This allows an improvement to be described below.

Figure 5:
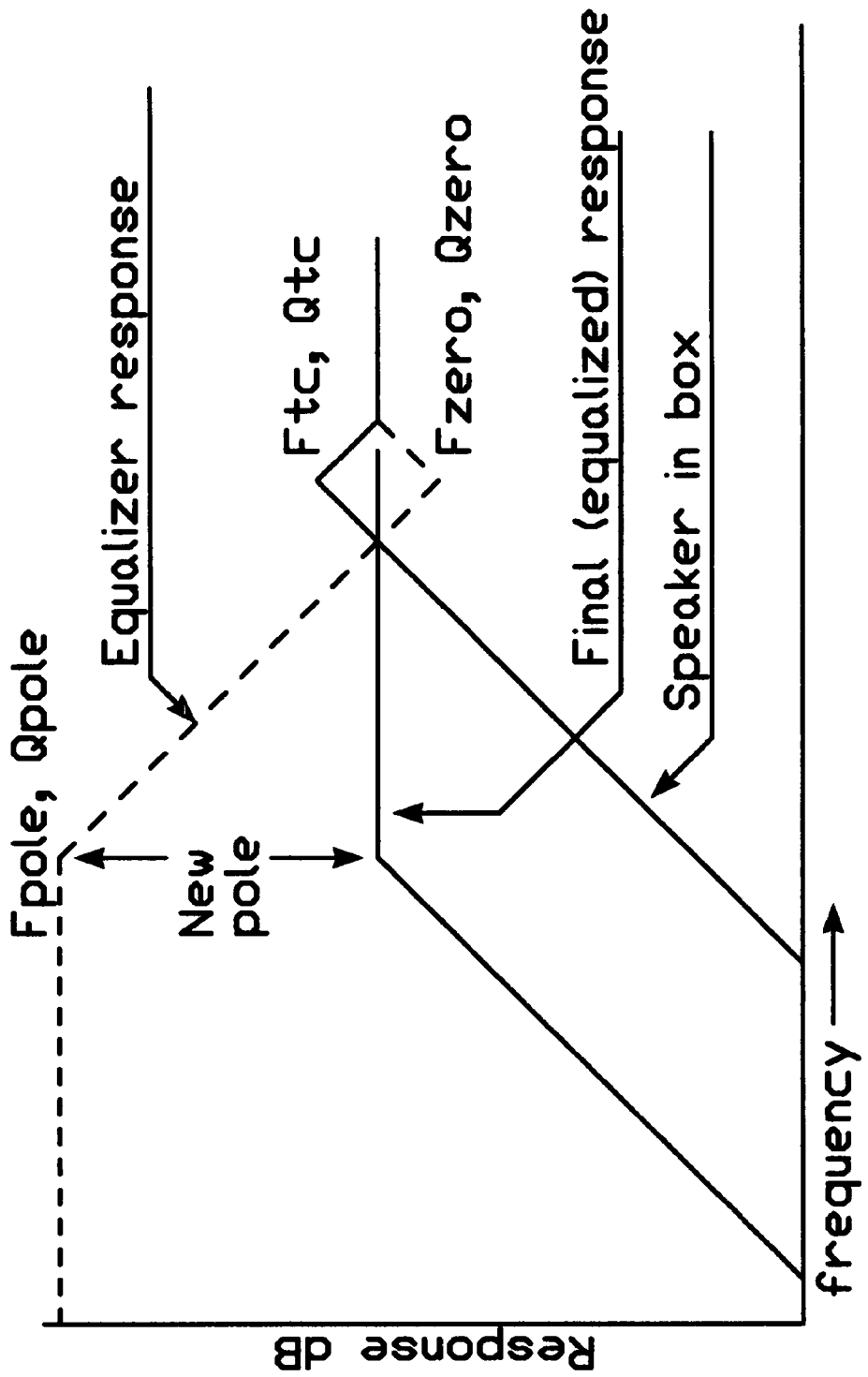
FIG. 5 is a graphical depiction of the relationship between woofer output (dB) and frequency showing the effect of the equalizer system shown in FIGS. 3 and 4.

Graphically, the effect of the equalizer circuit is shown in FIG. 5. It is noted that the equalizer response creates a new pole while the response vs. frequency characterization of the speaker in its cabinet shifts as depicted in FIG. 5.

Because the entire arrangement substitutes amplifier power for moving mass (as a way of overcoming the increased stiffness), it is important to recognize that the transducers must be constructed so as to withstand high power inputs at low frequencies. The rate of increase of response of the equalizer with decreasing frequency is 12 dB/octave. Put another way, if the equalization extends from 70 Hz downward to 20 Hz (typical values) then the required amplifier power at 20 Hz will be 21.7 dB greater than at 70 Hz (in a Bode straight-line approximation). This is a power ratio of 148:1. This is not a problem because the previously optimized woofers can have very high sensitivity. The elevated sensitivity comes from the fact that the conversion efficiency is proportional to the resonant frequency cubed, and inversely proportional to the stiffness.

There is a further advantage to this arrangement. In a conventional woofer system, the entire useful operating range is above the fundamental resonance of the enclosed system and is therefore mass-controlled. In a mass-controlled system, the acoustic output lags the electrical input by 90 degrees. At long wavelengths this is significant because 90 degrees at 50 Hz is equivalent to a 5 foot distance, i.e., temporally the woofer is 5 feet more distant. In a conjugately-equalized system as the one described, the behavior is effectively resistance-controlled over most of the operating range. In the example cited above the system will be resistive from about 20 Hz to about 80 Hz which is the entire operating range in many applications. In such a system, the acoustic output is in-phase with the electrical input so no additional delay is present.

The present invention represents a significantly powerful technique because it turns the design process on its head. Usually one would:
a. Choose the box size
b. Choose a desired lower frequency limit
c. Try to find (or design) a driver which will get you there.

Usually, and especially for a small box and a low cutoff frequency, the driver has to have a loose suspension and a high moving-mass. This is the only way the resonance can be held to a low frequency. Unfortunately, this combination of attributes leads directly to poor electro acoustic conversion efficiency and poor acceleration hence poor rendering of the attack of bass sounds. These are the well known deficiencies of so-called "acoustic suspension" woofer systems. The tradeoffs for remedying this in a conventional system are unyielding.

With the present invention, however, one would:
a. Optimize the driver with respect to motor strength, low mass and high suspension stability;
b. Choose the box size;
c. Choose the lower frequency limit;
d. Measure the Ftc, Qtc of the speaker in the box; and
e. Set up the equalizer accordingly.

The use of equalization increases the power demand below Fz compared to Fz and above. This is not the liability it might seem. This is because the efficiency due to the high Ftc is substantially increased so the starting point for looking at the power demand is much lower. Given the statistics of low-frequency content in music and movies, the average power required for a woofer system employing the present invention is usually less than for a conventional one.

The methodology described above perfects the frequency response of the woofers for small signals. It should be noted that woofers are generally called upon to reproduce large signals as there is often high acoustic power at low frequencies in music. Regardless of the method used to achieve flat frequency response, there is still the consideration that the required axial displacement of the diaphragms of the woofers is inversely proportional to the square of the frequency. For example, to produce the same sound pressure at 25 Hz as is produced at 50 Hz, the diaphragms of the woofers must travel 4 times as far. Normally this leads to a situation where the woofers can reach their excursion limits at very low frequencies. In the instant invention the equalization is already present and it can be conveniently modified on a dynamic basis to prevent said excessive diaphragm excursion.

Figure 6:
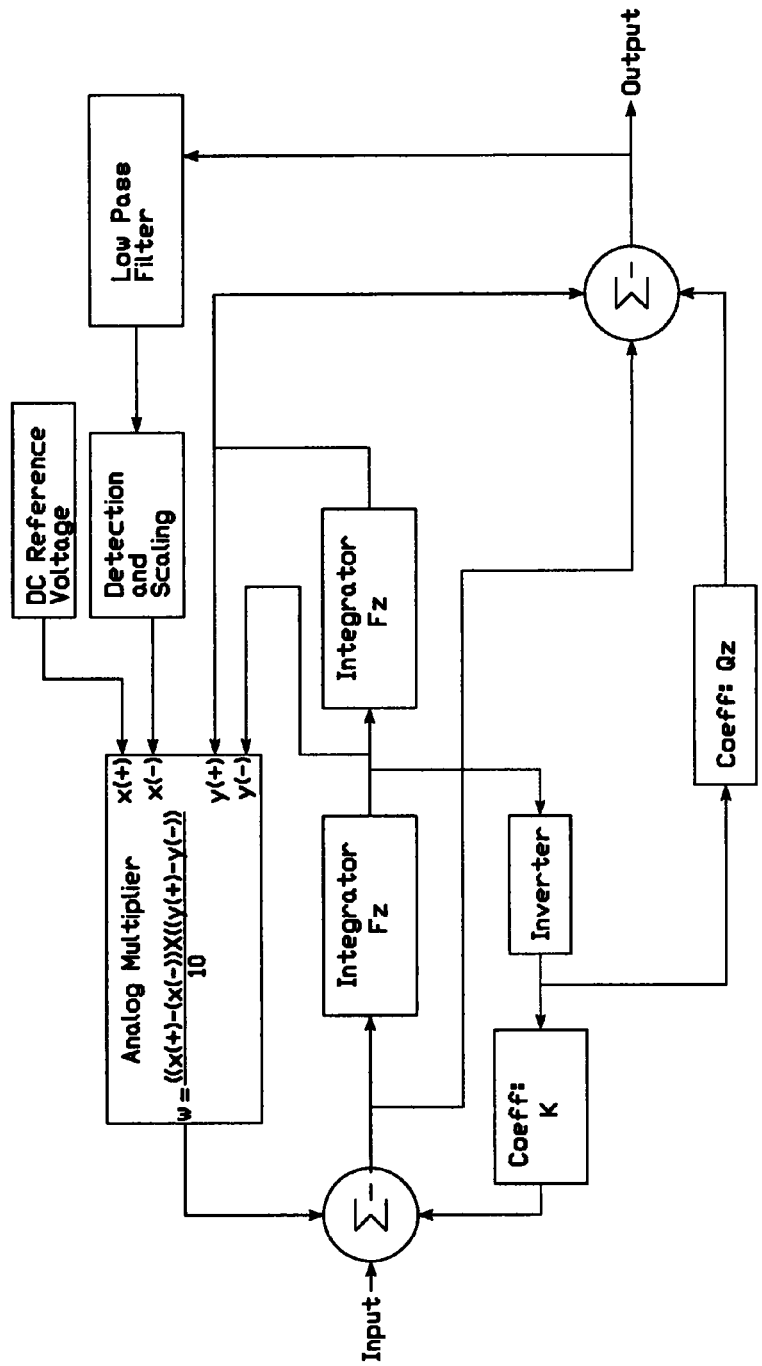
FIG. 6 is a block diagram of the equalizer with voltage-controllable adjustment of the equalization frequency ratio and control sidechain.
Figure 7:
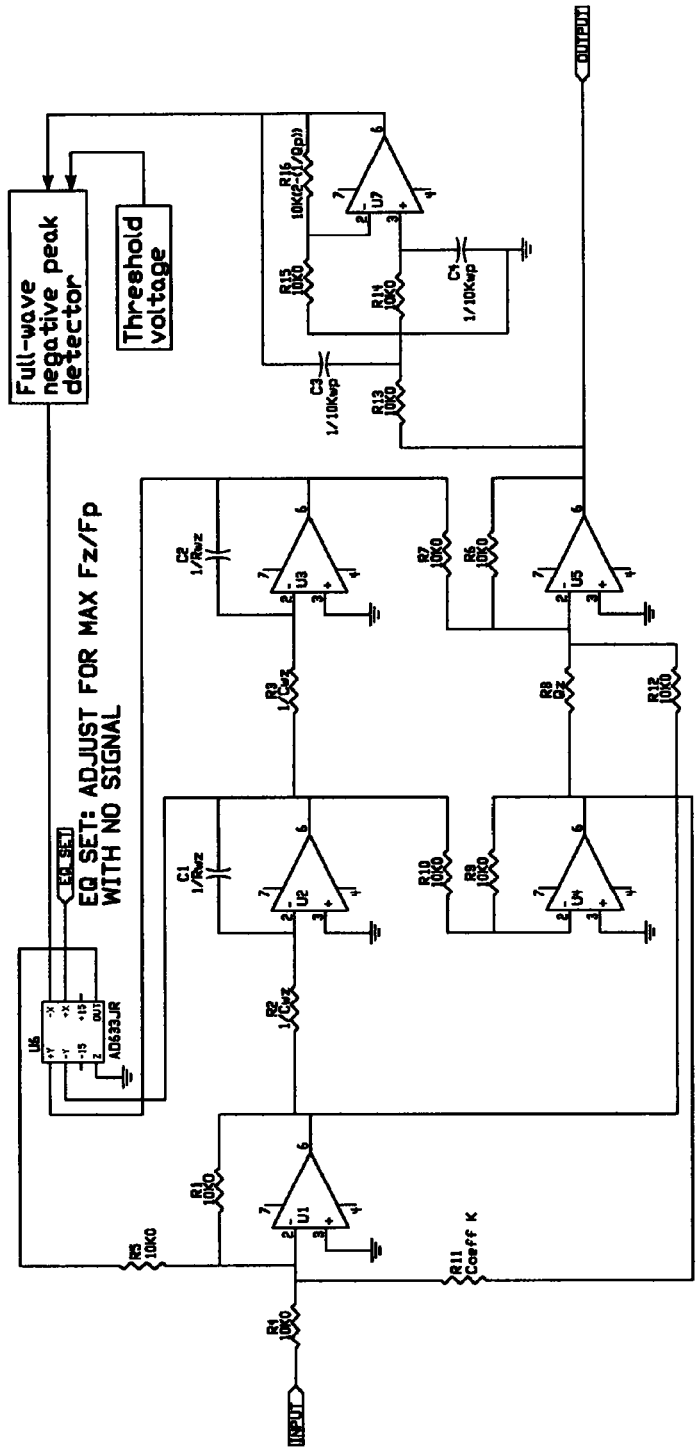
FIG. 7 is a schematic diagram of the variable equalizer.

As noted above, the use of the 2 integrator state-variable filter topology allows this control. What is required at high amplitudes is to change the ratio of Fz/Fp independently of the other three parameters, Fz, Qz and Qp. This can be accomplished by introducing a multiplier circuit in the feedback path for the frequency ratio and the pole damping as shown in FIGS. 6 and 7. The equations for this implementation are as follows: Assume the multiplier solves $(((+x)-(-x) \times (+y)-(-y))/10)$, i.e. the product of the differential inputs divided by 10. The control coefficient is $(10/(+x)-(-x))=V$.

$$V=(10/(+x)-(-x))=(Fz/Fp)^2$$

K=added ping coefficient $$Qp=(K\sqrt{V})/(V+K)$$

The reason for the presence of K is that without it, V will control the square of the frequency ratio, but will control Qp linearly. This could be solved by adding another multiplier but would be an unnecessarily complicated solution. Instead, adding a fixed damping term, K will cause Qp to remain constant within about 10 percent. The practical consequence of this is less than 1 dB in amplitude at the dynamically adjusted cutoff frequency and is not audible in practice.

It remains to control V. For this purpose, the audio signal is passed through a second order low-pass filter which has the same frequency as Fp unmodified, (i.e. Fz/Fp is at the static maximum value, see below) and the same Q as Qp. The output of this filter varies with frequency the same as the diaphragm excursion of the woofers, so it effectively is an analog of the diaphragm motion. This voltage is then scaled and peak-detected above a predetermined threshold and applied to the differential x input of the mutiplier. As the system attempts to overdrive the woofers, Fp will be shifted upward just far enough to prevent frequencies below it from causing excessive excursion. Because this process is dynamic, and is only applied to the extent required to prevent the overload there is almost no adverse audible effect.

It should be noted that the control law for Fp is dB/dB so that the control sidechain can be arranged as either feed-forward or feed-back. Many methods exist for peak-detection and detection threshold setting and the details are left to one skilled in the art of analog circuit design.

Example

The following assumptions are made in the present example:
1. The total box volume is 90 liters (3.18 cubic feet)
2. Two woofers are mounted identically on opposite sides of the box
3. The woofer nominal diameter is 300 mm (12")
4. The woofers are identical
5. The lower cutoff frequency is to be 20 Hz The driver is then optimized:
1. A low moving mass is chosen consistent with adequate structural strength in the diaphragm. A value of 45 grams is reasonable based on experience.
2. A mechanical compliance (Cm) is chosen which will give good stability to the suspension of the diaphragm. A value of 4.59E-4 meters/Newton is reasonable based on experience. For a 12" driver this equates to a compliance equivalent volume (Vas) equal to $Cm \times \rho_0 \times c^2 \times Sd^2$ where $\rho_0$ is the density of air, usually taken to be 1.18 kg/cubic meter, c is the velocity of sound usually taken to be 345.45 m/s and Sd is the surface area of the diaphragm which for a 300 mm nominal driver is about 0.045 square meters. Vas represents the volume of air whose compressibility is equal to the mechanical compliance. Vas in this case is equal to 131 liters.
3. The mass and compliance chosen above will result in a fundamental resonance frequency of 35 Hz.
4. The total damping of the driver resonant system is established by the motor strength expressed as the product of B, flux density in the gap and L, the length of voice-coil conductor in the gap. Actually there are two sources of damping, the pure mechanical losses of the moving system (Qm) and the force exerted by the motor. In a well optimized driver the motor damping completely dominates. The motor damping alone is called Qe, the electrical Q. It is established by the relationship $Qe=DCM(B \times L)^2 \times 2\pi Fs \times Cm)$. Since Cm and Fs have already been determined, the Qe depends on DCR, the voice coil resistance and B×L.
5. Motor design in loudspeakers is superficially simple but actually requires considerable experience, and/or the use of assistive software which is commercially available. Those skilled in the art will recognize that a motor with a B×L product of about 20 Tesla meters and a DCR of 7 Ohms is quite feasible. These values, along with the determinations made above will yield Qe=0.173.
6. In the woofer system of the present example the drivers are connected electrically in parallel. The result is that the DCR drops in half and B×L remains unchanged. However, total force developed by the two motors is equal to B×L×I, where I is the current through the voice coil. For a fixed applied voltage, I doubles because DCR dropped in half. Therefore the total force is double.
7. To summarize the resulting driver parameters:
   a. Nominal diameter=300 mm
   b. DCR=7 Ohms, 3.5 Ohms for 2 drivers in parallel
   c. B×L=20 Tesla meters
   d. Fs=35 Hz
   e. Qe=0.173, and assuming Qm=5, then
   f. Qt=0.167. Qt is the parallel combination of Qe and Qm.
   g. Vas=262 liters for 2 drivers There is now sufficient information to design the equalizer.

It is well known to those skilled in the art, that the parameters of the drivers as modified by the enclosure is easily calculated. The required computational inputs are:
1. The box volume
2. The Vas of the intended drivers
3. The Qt of the intended drivers The compliance ratio, $\alpha$ (alpha) is equal to Vas/Vbox. In this case $\alpha=262/90=2.911$ Then the term sqrt($\alpha$+1) is found equal to 1.978 (2 for practical purposes).

This means that when the two optimized drivers are mounted in the 90 liter box, or separately in 45 liter boxes as shown in FIG. 1, the new values Ftc and Qtc will appear. These are the modified values of the fundamental resonance due to the stiffness of the air in the box. They are found by multiplying Fs and Qt by 1.978. Thus, Qtc=0.334 and Ftc=70 Hz.

Taken by themselves, these are unattractive parameters for a complete system. The Ftc is too high and in this case the Qtc is too low. The result will be deficient low frequency response.

Referring to the equalizer circuit of FIG. 4A, the design objectives are met as follows:
1. Qz is set equal to Qtc=0.334. Thus R8 is set for 3.34 KΩ.
2. Fz is set equal to Ftc=70 Hz. Thus, assuming C1 and C2 are arbitrarily chosen to be 100 nanoFarads (nF), then R2 and R3 must equal 22.74 KΩ.
3. The values indicated for R8, C1, C2, R2 and R3 cancel the driver characteristic.
4. The new low frequency pole is set according to the system design objectives given. For a maximally flat response with a lower limit of 20 Hz, Fpole=20 Hz and Qpole=0.71, a so-called Butterworth alignment.
5. Thus $R5=(70/20)^2 \times 10$ KΩ=120.2 KΩ, and R11=0.71 (70/20)×10 KΩ=24.8 KΩ.
6. The total resulting boost between frequencies >>70 Hz and <20 Hz, in dB, will be equal to 40 log (70/20)=21.7 dB. This corresponds to a power ratio of 147:1. It can be seen that this approach requires significant power and the design details to handle such power reliably. The means to do this will be well known to those skilled in the art.

Referring to FIGS. 6 and 7, the reconfiguration for dynamic adjustment of the Fz/Fp parameter is shown. For purposes of illustration consider a slightly different set of unequalized woofer parameters and a slightly different design objective:
1. Qz is set equal to Qtc=0.50. Thus R8 is set for 5.00 KΩ
2. Fz is set equal to Ftc=60 Hz. Thus, assuming C1 and C2 are arbitrarily chosen to be 100 nF, R2 and R3 must equal 26.5 KΩ.
3. The values indicated for R8, C1, C2, R2 and R3 cancel the driver characteristic.
4. The new low frequency pole is set according to the system design objectives; in this case Fpole=20 Hz and Qpole=1.
5. Thus coefficient K is calculated as described earlier to be about 4.5, thus R11=45 KΩ.
6. The equalization set voltage is adjusted for Fz/Fp=60/20=3. This requires 1.11 Volt at the x(−) input of the multiplier with respect to the x(+) input.
7. The low-pass filter in the control chain is set the same as the system objective; Fp=20 Hz, Qp=1. Thus C3 and C4=795 nF and R16=10 KΩ.

The full-wave negative peak detector indicated in FIGS. 6 and 7 must perform the detection only after the input to it has exceeded a certain threshold. This is related to the voice-coil voltage at which the woofers reach their maximum allowable excursion at Fp minimum (i.e. Fz/Fp maximum). This requires the voltage gain of the power amplifier to be known. This amplifier is not shown but is connected between the output of FIG. 7 and the woofers. For example:
1. Assume the maximum input voltage to the woofers, which are connected in parallel so the voltage is the same on both of them, is 40 Volts rms which is equal to 56.56 Volts peak.
2. Assume the power amplifier voltage gain is 20. This means that when the voltage at the output of FIG. 7 reaches 2V rms at Fp minimum, the woofers will be at their mechanical limit.
3. The low-pass filter, U7, has a gain of 2 in the passband, so 2V rms at the output of FIG. 7 will cause 4V rms at the input to the negative peak detector. The peak value of 4V rms is 5.656V which is the threshold of operation. Signals larger than this will cause Fp to rise, thus reducing the total boost and preventing excessive excursion of the woofers. The low-pass filter, U7, conditions the detector input according to the excursion vs frequency characteristic of the woofers.

Figure 8:
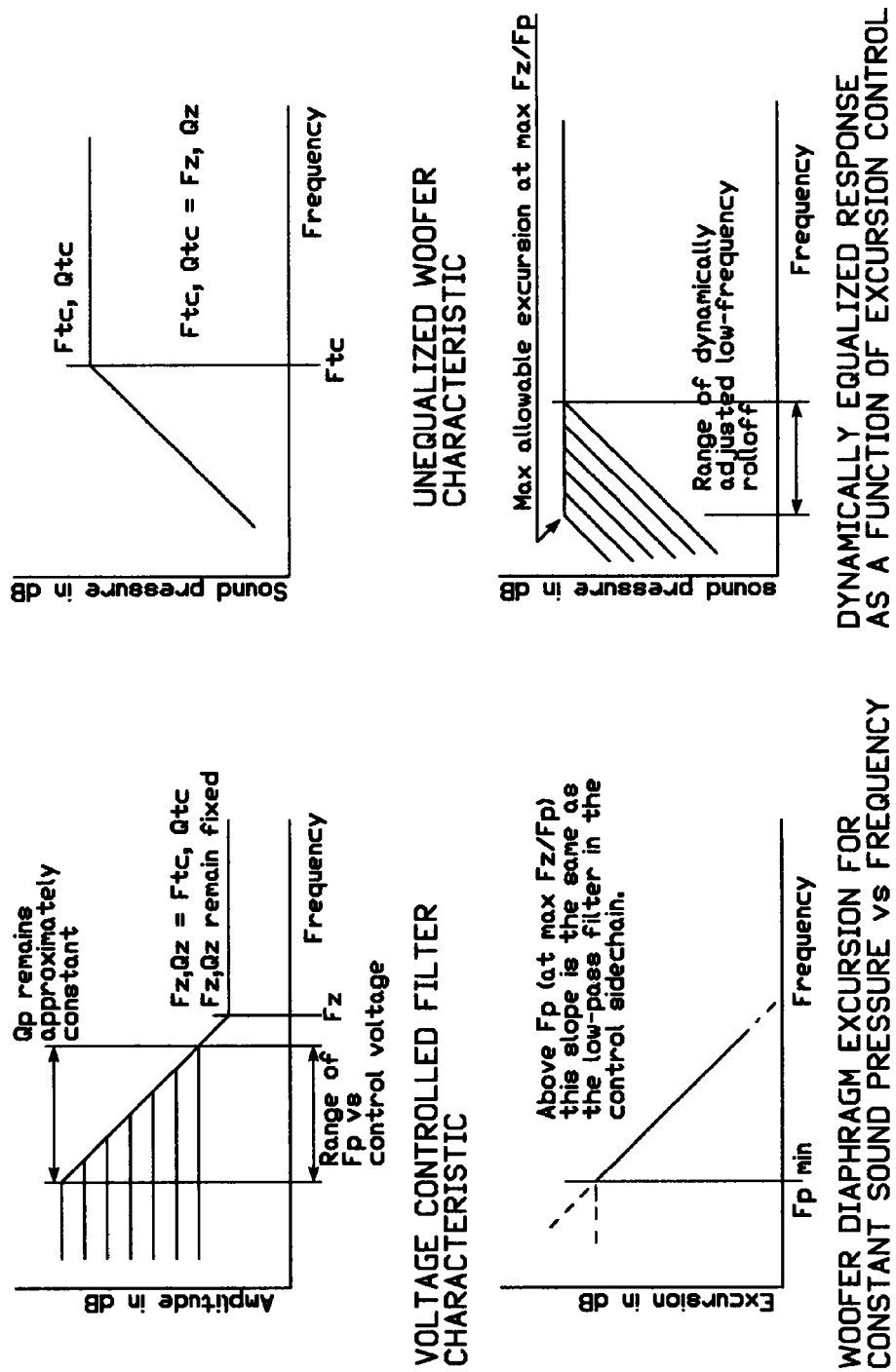
FIG. 8 shows the effect of the variable adaptive equalization.

FIG. 8 shows the various relationships for the adaptive embodiment of the equalizer.
1. The voltage controlled filter characteristic describes how the filter changes with changes in ((x(+)−x(−)), the differential control input.
2. The unequalized woofer characteristic is to be corrected by the filter by setting Fz and Qz of the filter equal to Ftc and Qtc of the woofer, respectively.
3. The woofer diaphragm excursion vs frequency relationship shows the inverse square relationship for constant sound pressure.
4. The dynamically equalized response shows that above the threshold of detection, the reduction of Fz/Fp causes a reduction in the output below the inflection point which eliminated excessive excursion of the woofer diaphragms.

What is claimed is:

1. A system for optimizing low frequency audio response, comprising:
   one or more low frequency transducers electrically connected to a power amplifier and an audio input, said one or more low frequency transducers emanating low frequency audio signals into an enclosed volume; and
   an equalizer placed between said power amplifier and said audio input, wherein said equalizer is adapted to (a) characterize the resonant frequency (Fs) and amplitude (Q) of the high-pass complex pole of said one or more low frequency transducers emanating low frequency audio signals into said enclosed volume, (b) cancel the complex pole of said one or more low frequency transducers, and (c) establish a new variable complex pole for establishing a lower cut off frequency below which the output generated by low frequency transducers diminishes.

2. The system of claim 1, wherein said one or more are mounted in a closed cabinet.

3. The system of claim 1, wherein said one or more transducers are mounted in separate closed cabinets.

4. The system of claim 1, wherein said variable complex pole is electrically controllable.

5. The system of claim 4, wherein said electrical control is determined by an electrical analog of the diaphragm excursion of said one or more tranducers.

6. The system of claim 1, wherein the moving mass of the one or more transducers is not increased.

7. The system of claim 1, wherein the stiffness of the one or more transducers is not decreased.

8. The system of claim 1, wherein the equalizer comprises two integrators.

9. The system of claim 1, wherein the enclosed volume comprises a volume of air with stiffness, and the resonant frequency and amplitude are raised in value due to the stiffness of the air in the volume.

\* \* \* \* \*